(12) United States Patent
Rieve et al.

(10) Patent No.: US 7,282,382 B2
(45) Date of Patent: Oct. 16, 2007

(54) METHOD FOR PRODUCING A PHOTODIODE CONTACT FOR A TFA IMAGE SENSOR

(75) Inventors: Peter Rieve, Windeck-Dattenfeld (DE); Konstantin Seibel, Siegen (DE); Michael Wagner, Bretnig-Hauswalde (DE)

(73) Assignee: STMicroelectronics N.V., Amsterdam (NL)

( * ) Notice: Subject to any disclaimer, the term of this patent is extended or adjusted under 35 U.S.C. 154(b) by 308 days.

(21) Appl. No.: 11/088,249

(22) Filed: Mar. 23, 2005

(65) Prior Publication Data

US 2005/0287695 A1  Dec. 29, 2005

Related U.S. Application Data

(63) Continuation of application No. 10/493,993, filed as application No. PCT/DE02/04008 on Oct. 24, 2002, now abandoned.

(30) Foreign Application Priority Data

Oct. 29, 2001   (DE)   ................................ 101 52 776

(51) Int. Cl.
*H01L 21/00*   (2006.01)
(52) U.S. Cl. ..................... 438/48; 438/57; 257/E21.366
(58) Field of Classification Search .................. 438/48, 438/57, 73, 22; 257/233, E21.366
See application file for complete search history.

(56) References Cited

U.S. PATENT DOCUMENTS

| | | | |
|---|---|---|---|
| 3,971,065 A | 7/1976 | Bayer | |
| 4,285,007 A | 8/1981 | Nakano et al. | |

(Continued)

FOREIGN PATENT DOCUMENTS

EP   1113499 A2   7/2001

(Continued)

OTHER PUBLICATIONS

International Search Report from International application No. PCT/DE02/03964, filed Oct. 10, 2002.

(Continued)

*Primary Examiner*—Phat X. Cao
(74) *Attorney, Agent, or Firm*—Lisa K. Jorgenson; James H. Morris; Wolf, Greenfield & Sacks, P.C.

(57) ABSTRACT

The invention relates to a method for producing a photodiode contact for a TFA image sensor which includes a photodiode, produced by deposition of a multilayer system and a transparent conductive contact layer on an ASIC circuit that has been coated with an intermediate metal dielectric component and that has vias in a photoactive zone which are arranged on a pixel grid. Said vias extend through the intermediate metal dielectric component and are linked with respective strip conductors of the CMOS-ASIC circuit. A pixel-grid structured barrier layer, and on top thereof a CMOS metallization, are arranged on the intermediate metal dielectric component. The aim of the invention is to improve the characteristic variables of the photodiode by simple technological means. This object is achieved by removing at least the CMOS metallization present on the CMOS-ASIC circuit in the area of the photoactive zone except for the structured barrier layer and subsequently applying the multilayer system of the photodiode and the conductive transparent contact layer to the CMOS-ASIC circuit.

24 Claims, 9 Drawing Sheets

U.S. PATENT DOCUMENTS

| | | | |
|---|---|---|---|
| 5,936,261 A * | 8/1999 | Ma et al. .................. | 257/59 |
| 6,111,247 A | 8/2000 | Sengupta | |
| 6,373,117 B1 | 4/2002 | Theil | |
| 6,586,812 B1 | 7/2003 | Cao | |
| 2004/0041224 A1* | 3/2004 | Chao et al. ................ | 257/44 |

FOREIGN PATENT DOCUMENTS

WO    WO 02/50921 A1    2/2002

OTHER PUBLICATIONS

International Search Report from International application No. PCT/DE02/04008, filed Oct. 24, 2002.

Schneider et al., *Image Sensors In TFA (Thin Film on ASIC) Technology*, Handbook of Computer Vision and Applications pp. 237 to 270, Academic Press, San Diego, 1999.

P. Rieve et al., *a-Si:H Color Imagers abd Colorimetry*, Journal of Non-Crystalline Solids, vol. 266 to 269, pp. 1168 to 1172, (2000).

Schulte et al., *Intelligent Image Sensor For On-Chip Contour Extraction*, Proceedings of the SPIE, SPIE, Bellingham, VA, vol. 2247, Jun. 22, 1994, pp. 292-300, XP002080272.

Theil et al., *Hydrogenated Amorphous Silicon Photodiode Technology for Advanced CMOS Active Pixel Sensor Images*, Mat. Res. Soc. Symp. vol. 609, 2000 Materials Research Society pp. A14.31-A14.36.

* cited by examiner

METHOD FOR PRODUCING A PHOTODIODE CONTACT FOR A TFA IMAGE SENSOR

CROSS REFERENCE TO RELATED APPLICATIONS

This application is a continuation of U.S. application Ser. No. 10/493,993, filed Mar. 29, 2004 now abandoned entitled METHOD FOR PRODUCING A PHOTODIODE CONTACT FOR A TFA IMAGE SENSOR, which is incorporated herein by reference in its entirety.

BACKGROUND OF THE INVENTION

1. Field of the Invention

The invention relates to a method for producing a photodiode contact for a TFA image sensor with a photodiode by depositing a multi-layer system and a transparent, conductive contact layer on an ASIC circuit that has been coated with an intermediate metal dielectric component and that has vias in the pixel grid, which extend through the intermediate metal dielectric component and are each linked with a respective strip conductor of the ASIC circuit, wherein the intermediate metal dielectric component accommodates a barrier layer, which is structured in the pixel grid and carries a CMOS metallization.

2. Discussion of the Related Art

This type of optical component is used to convert electromagnetic radiation into an intensity-dependent photocurrent. Such a TFA sensor (thin-film-on-ASIC sensor) consists of a matricial or linear system of image points (pixels). The electronic circuits for operating the sensor (e.g., pixel electronics, peripheral electronics, system electronics) are usually fabricated using CMOS-based silicon technology, and include an application-specific integrated circuit (ASIC). Separated from it by an insulating layer and connected with it by corresponding electrical contacts, a multi-layer system is arranged on the ASIC as a photodiode, which converts electromagnetic radiation into an intensity-dependent photocurrent. This photocurrent is transferred to specific contacts present in each pixel by means of vias (throughplating) of the underlying pixel electronics (B. Schneider, P. Rieve, M. Böhm, Image Sensors in TFA (Thin Film on ASIC) Technology, ed. B. Jähne, H. Hausecker, P. Geißler, Handbook of Computer Vision and Applications, pp. 237-270, Academic Press, San Diego, 1999). The multi-layer system based on hydrogenated, amorphous silicon (a-Si:H) that comprises the photodiode consists of a bottom n-type a-Si:H layer, an intrinsic a-Si:H layer and a p-type a-Si:H layer, for example. The transparent, conductive contact layer located on this multi-layer system serves as a front electrode for the photodiode.

Such a multi-layer system is described in "J. A. Theil, M. Cao, G. Kooi, G. W. Ray, W. Greene, J. Lin, A J. Budrys, U. Yoon, S. Ma, H. Stork, Hydrogenated Amorphous Silicon Photodiode Technology for Advanced CMOS Active Pixel Sensor Imagers, MRS Symposium Proceedings, vol. 609, 2000." The photodiode is here formed by a pin configuration based on amorphous silicon, i.e., by an amorphous silicon layer comprised of a p-conducting, self-conducting (intrinsic) and n-conducting layer sequence. The n-layer is usually the lowermost layer facing the ASIC. The electrical contacts are formed on this side facing the ASIC by a structured metal layer, for example, while the contact on the side facing the direction of incident light is generally established by the transparent and conductive layer.

SUMMARY OF THE INVENTION

Structural components above and beyond the pin photodiode are also possible, e.g., Schottky photodiodes, or components with a controllable spectral sensitivity (P. Rieve, M. Sommer, M. Wagner, K. Seibel, M. Böhm, a-Si:H Color Imagers and Colorimetry, Journal of Non-Crystalline Solids, vol. 266-269, pp. 1168-1172, 2000). This basic structure can be further expanded to include additional, preceding layers in the direction of incident light, e.g., color filter layers (e.g., Bayer pattern, U.S. Pat. No. 3,971,065).

The type of electrical contact established between the photodiode and CMOS pixel circuit, in particular the choice of materials used for this purpose, is of vital importance relative to the parameters of the photodiode, especially as regards its dark current.

The object of the invention is to provide a method to produce a photodiode contact for a TFA image sensor that has been optimized relative to the photodiode parameters while simultaneously being as easy as possible to realize from a technological standpoint. Another boundary condition involves the requirement that the surface topography be flat in comparison to the thickness of the photodiode, which is absolutely essential with respect to a low dark current.

The object according to the invention is achieved in a method of the kind mentioned at the outset by removing at least the CMOS metallization located on the ASIC circuit in the photoactive area up to the structured barrier layer, and subsequently applying the multi-layer system of the photodiode along with the conductive, transparent contact layer onto the ASIC circuit. The structured barrier layer here forms the back electrodes of the photodiodes.

This yields a photodiode contact that is optimized relative to the photodiode parameters, and this with the use of relatively simple technological means.

The invention can be carried a step further by removing the CMOS metallization in the photoactive area along with the barrier layer situated under it, thereby exposing the intermediate metal dielectric component with vias imbedded therein, and then applying the photodiode and conductive, transparent contact layer. In this case, the vias make up the back electrodes of the photodiodes.

The photodiode parameters are further improved by applying a pixel-grid structured metal layer, preferably including chromium, or a chromium alloy, onto the intermediate metal dielectric component or the structured barrier layer. In this case, the structured metal layer makes up the back electrodes of the photodiodes.

As an alternative, a doped silicon layer also structured in the pixel grid can be applied onto the intermediate metal dielectric component or structured barrier layer. This layer can also be fabricated as a doped layer including amorphous silicon, microcrystalline silicon or alloys thereof. In this case, the structured, doped silicon layer makes up the back electrodes of the photodiodes.

In another advantageous variant of the method according to the invention, the doped silicon layer is applied following the application of the pixel-grid structured metal layer.

BRIEF DESCRIPTION OF THE DRAWINGS

The invention will be described in greater detail below based on several exemplary embodiments. The accompanying drawings show.

DETAILED DESCRIPTION

Figure 1:
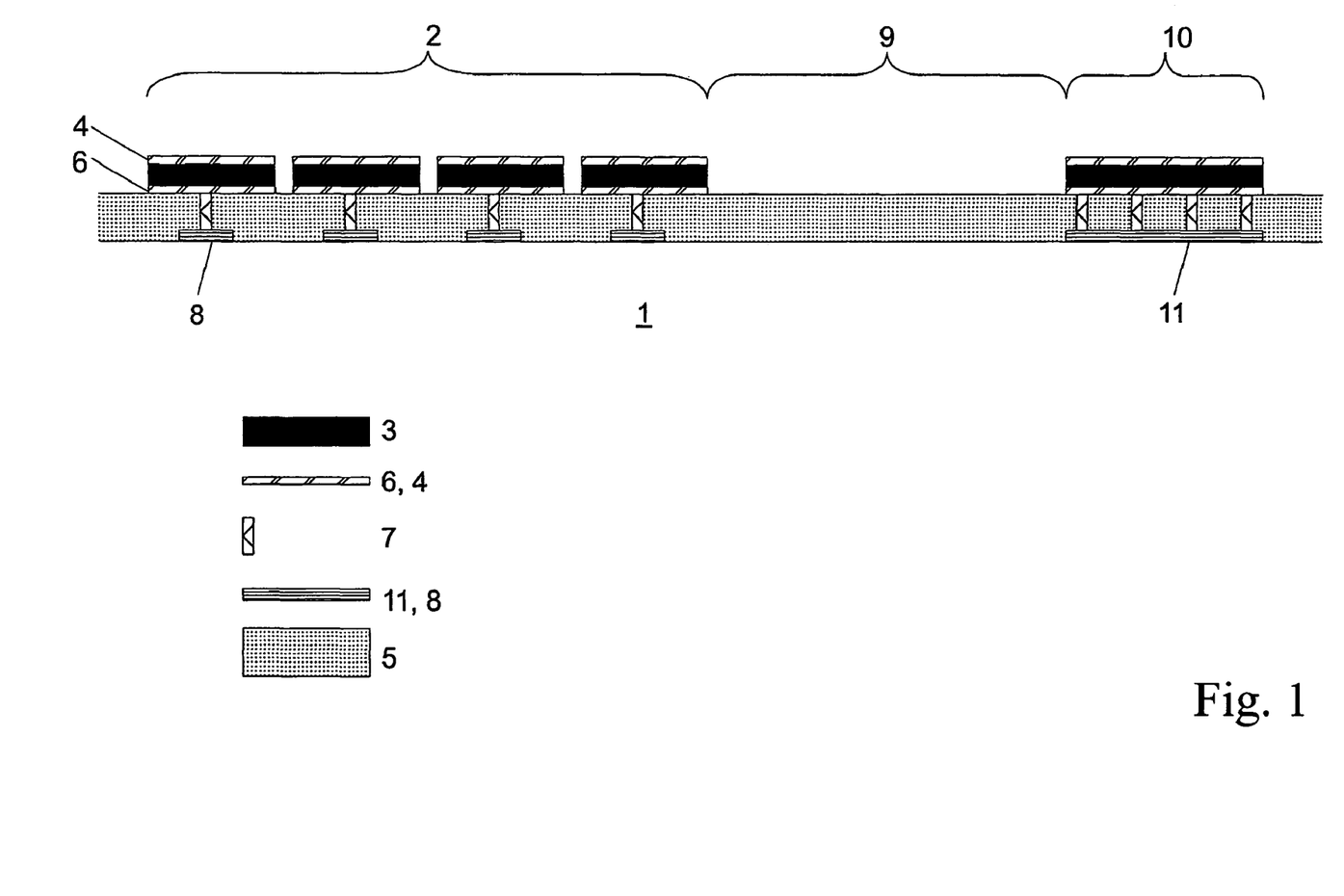
FIG. 1: A diagrammatic view of a CMOS ASIC circuit provided with intermediate metal dielectric component, with exposed uppermost metallization.

FIG. 1 first shows an exemplary diagrammatic view of a commercially available CMOS-ASIC circuit 1 provided to produce a TFA image sensor, wherein the uppermost CMOS metallization 3 (metal 2) has been initially exposed inside a photoactive area 2 by removing a CMOS passivation layer (not shown), e.g., by etching. Aside from this uppermost CMOS metallization 3, however, this CMOS-ASIC circuit 1 has a flat surface topography in the photoactive area 2 (pixel area). The CMOS metallization 3 structured in a pixel grid in a photolithographic procedure is covered with a thin barrier layer 4 and arranged on an intermediate metal dielectric component 5 of the CMOS-ASIC circuit 1, wherein an additional thin barrier layer 6 is situated between the CMOS metallization 3 and the intermediate metal dielectric component 5. The pixel-grid structured metal and barrier layer 4, 5, 6 is connected by vias 7 (throughplating) in an electrically conductive manner with underlying strip conductors 8 (metal 1).

FIG. 1 also shows an area of the peripheral electronics 9, along with a bond pad 10 for realizing an outer contact. The bond pad 10 was also structured from the CMOS metallization 3 (metal 2) in a photolithographic procedure, and is connected by vias 7 with an underlying strip conductor 11 (metal 1) of the CMOS-ASIC circuit.

Figure 2:
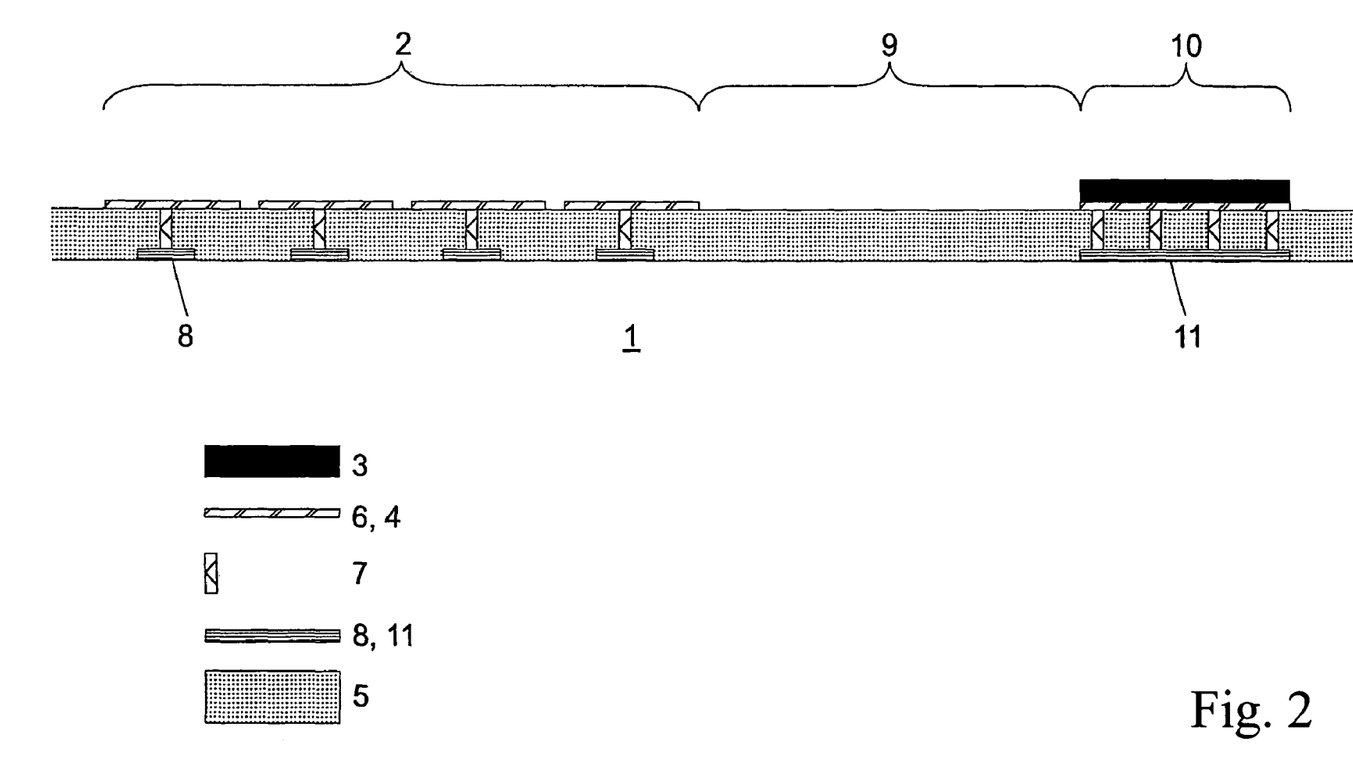
FIG. 2: The ASIC circuit according to FIG. 1, in which the uppermost CMOS metallization was removed, except for the bottom barrier layer.
Figure 3:
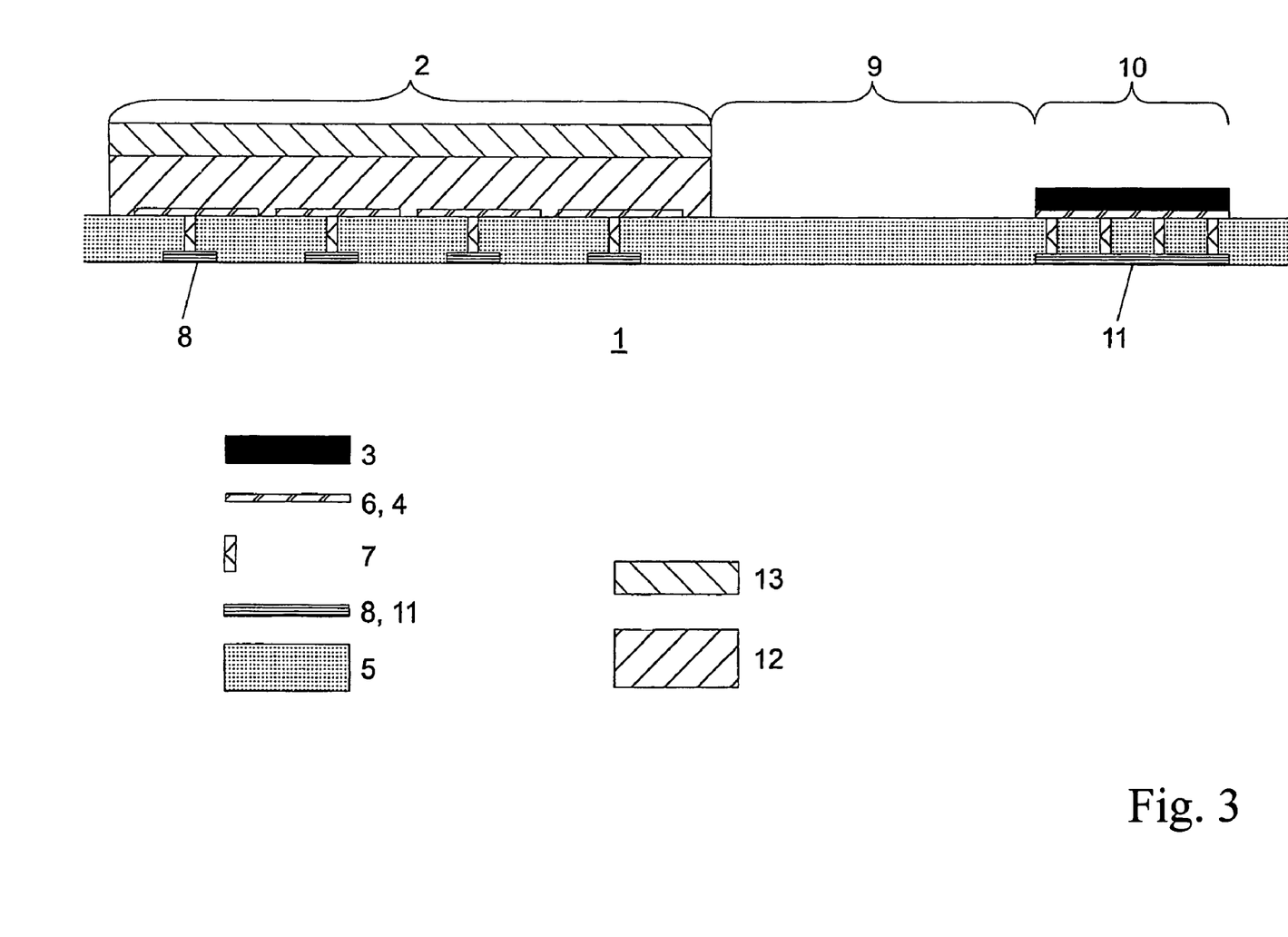
FIG. 3: The ASIC circuit according to FIG. 2, in which the multi-layer system of the photodiode including amorphous or microcrystalline silicon or alloys thereof was deposited on the structured barrier layer in the photoactive area.

In the method according to the invention, the uppermost CMOS metallization 3, which generally includes a multi-layer system, is removed except for the bottom thin barrier layer 6, e.g., made of titanium nitride (TiN), to fabricate the photodiode contacts (FIG. 2). This barrier layer 6 is connected with the CMOS-ASIC circuit by one or more vias 7, e.g., in the form of so-called tungsten plugs (W-plugs). The structures of the barrier layer 6 left behind after removing the overlying metal layers (e.g., TiN), which are less thick than the photodiode, are used as pixel back electrodes, i.e., the photodiode comprised of amorphous or microcrystalline silicon 12 or alloys thereof and a contact layer 13 are applied to it (FIG. 3). This sequence of layers can be built up easily using conventional CVD or PVD methods.

Figure 4:
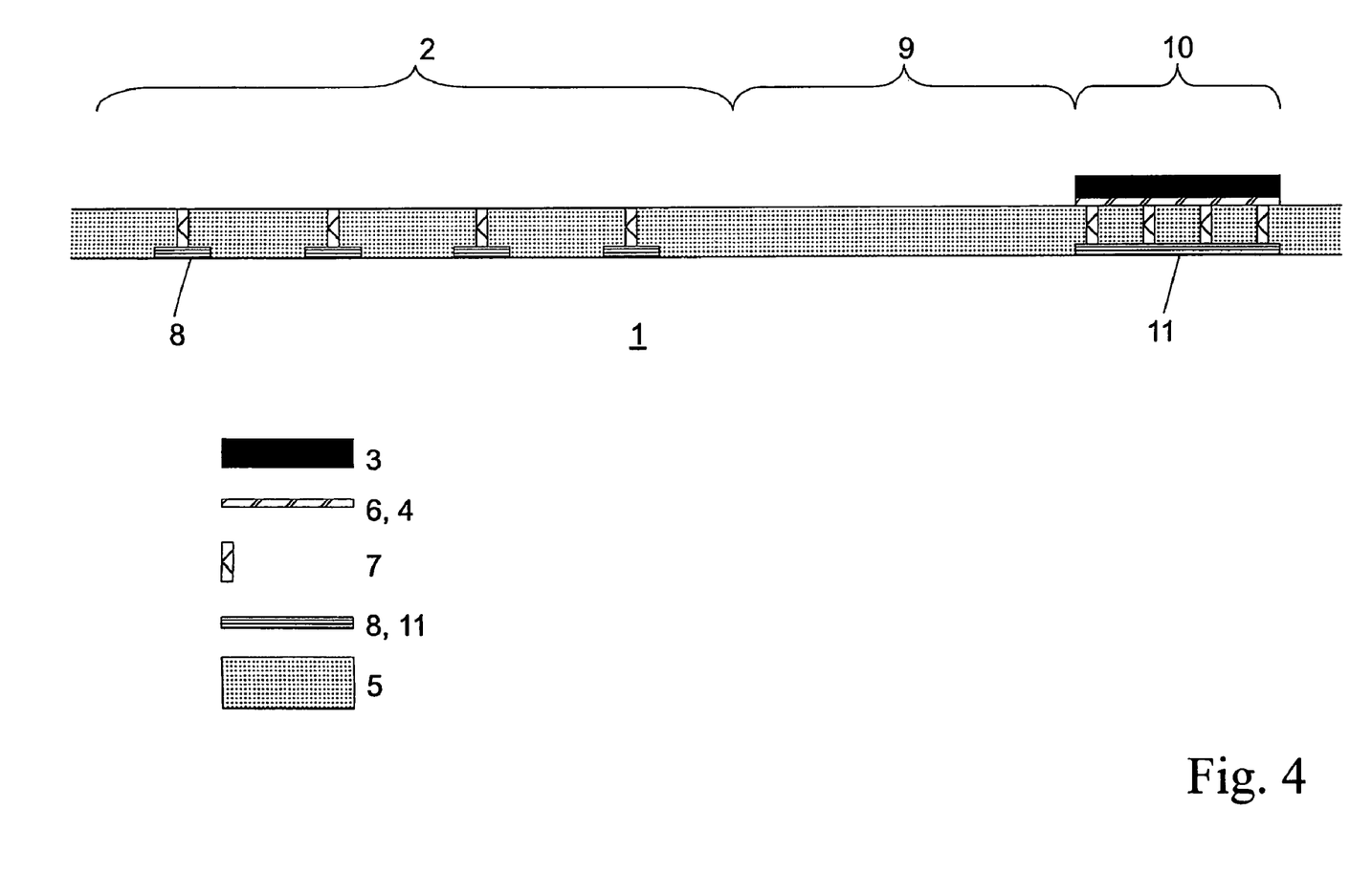
FIG. 4: The ASIC circuit according to FIG. 1, in which the uppermost metallization was removed in the photoactive area, including the barrier layer.
Figure 5:
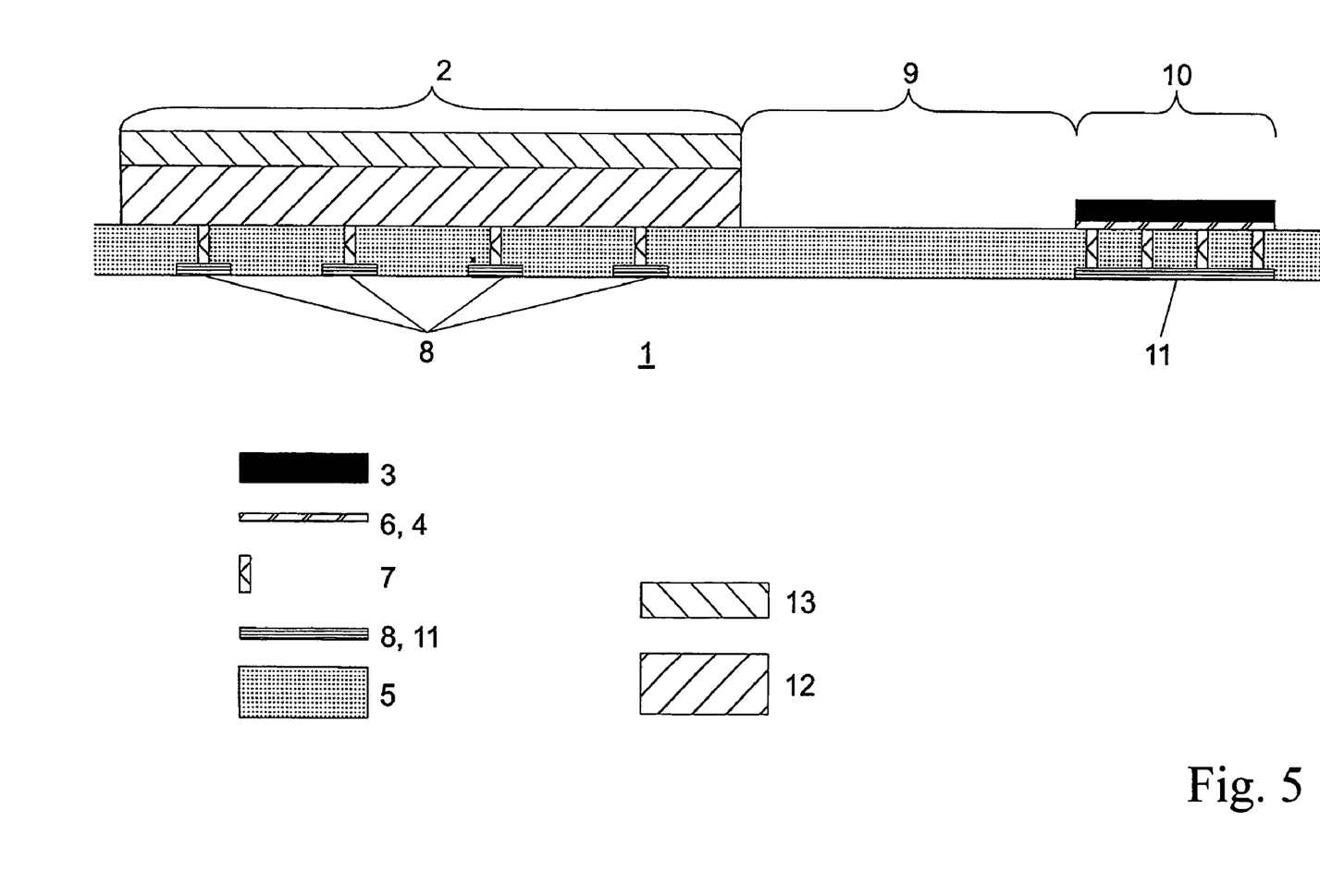
FIG. 5: The ASIC circuit according to FIG. 4, in which the multi-layer system of the photodiode in the photoactive area including amorphous or microcrystalline silicon or alloys thereof was deposited directly on the intermediate metal dielectric component with the vias of the ASIC circuit imbedded therein.

In a variant of the method according to the invention, the bottom barrier layer 6 in the photoactive area 2 is also removed in addition to the CMOS metallization 3 FIGS. 4, 5), and the vias 7 (e.g., W-plugs) that establish the contact to the CMOS pixel circuit here comprise the pixel back electrodes of the photodiodes. This variant is particularly suited for realizing small pixels.

Figure 6:
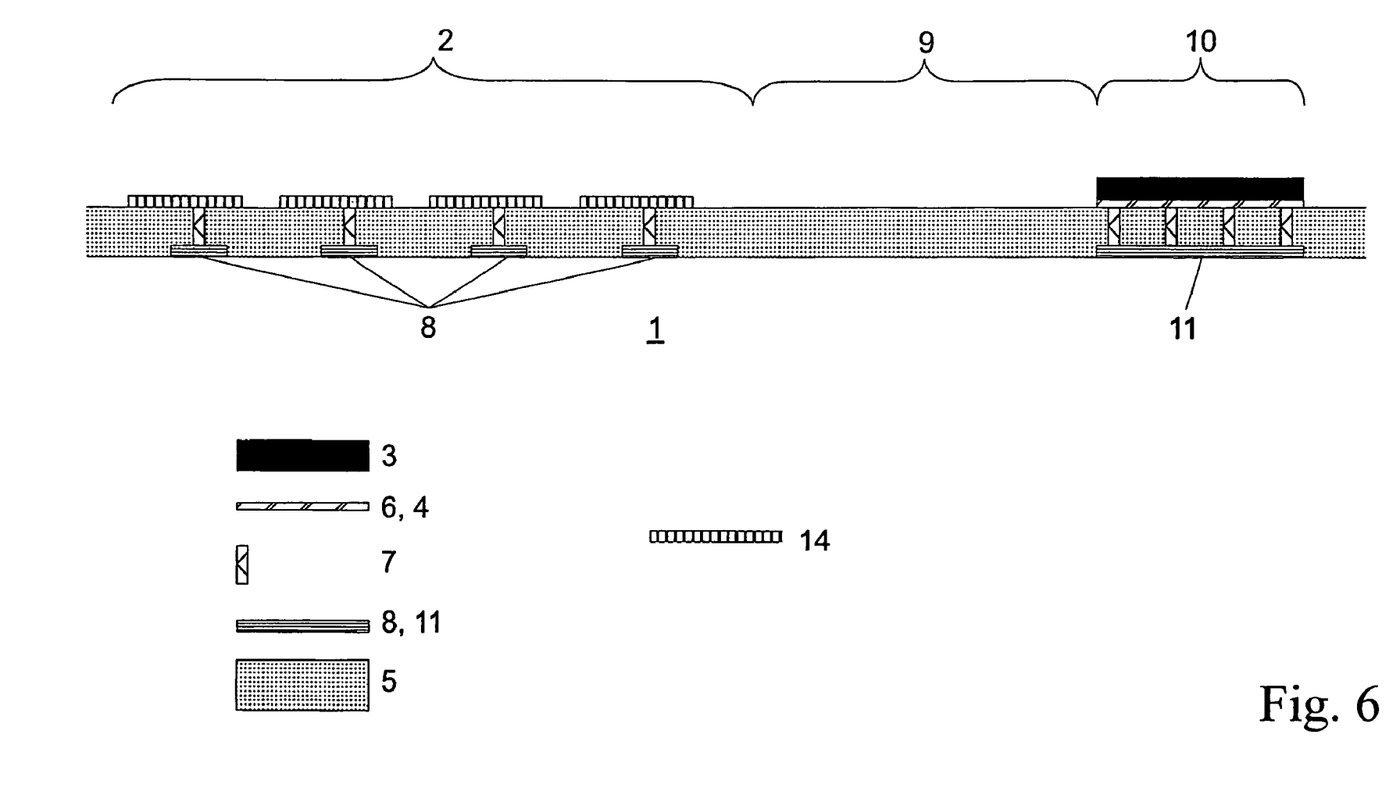
FIG. 6: The ASIC circuit according to FIG. 4, in which an additional metal layer structured in the pixel grid was deposited on a system of vias.
Figure 7:
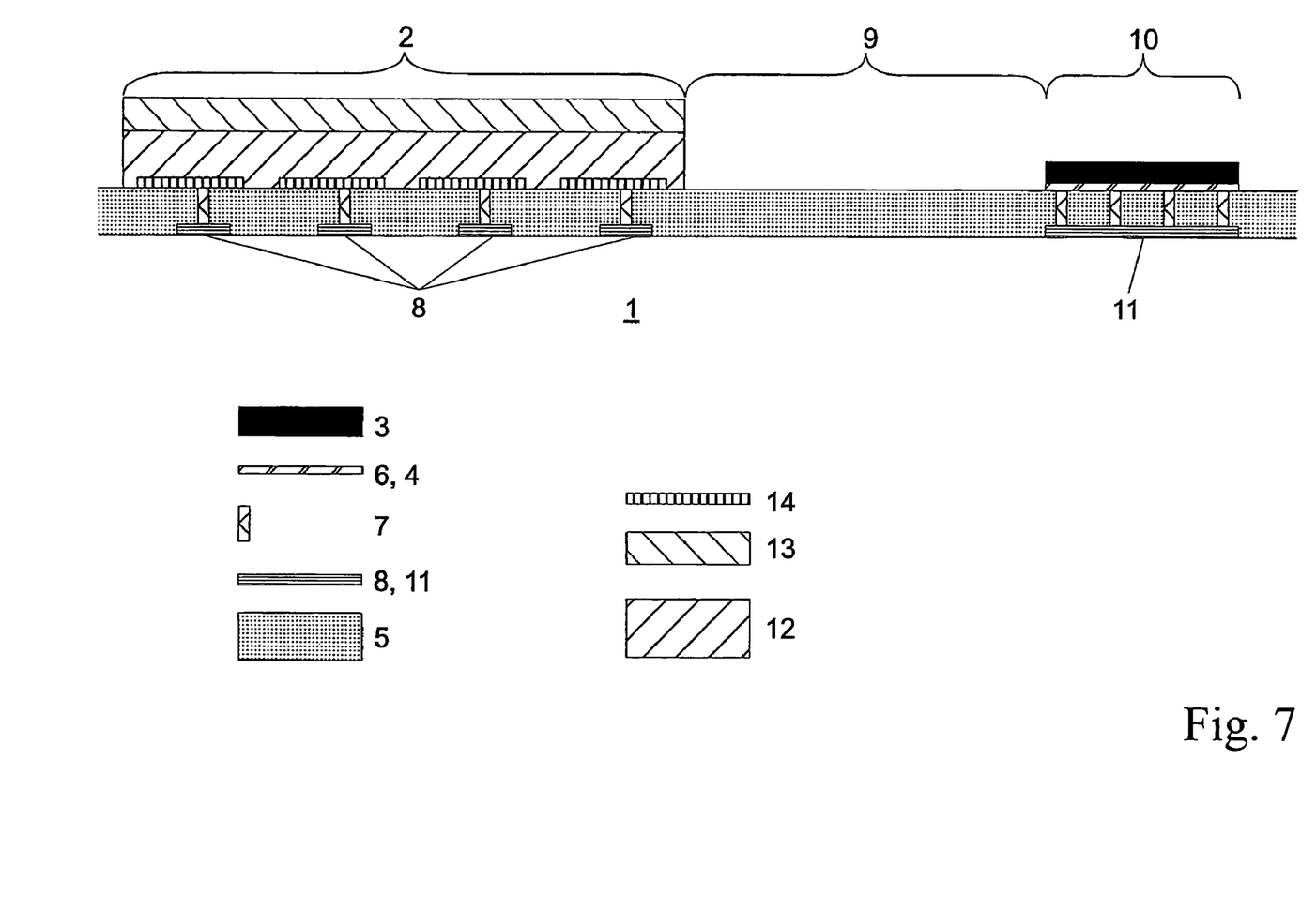
FIG. 7: The ASIC circuit according to FIG. 6, in which the multi-layer system of the photodiode in the photoactive area including amorphous or microcrystalline silicon or alloys thereof was directly deposited on the additional metal layer.

Finally, an additional metal layer 14, which is structured in the pixel grid and functions as the pixel back electrode FIGS. 6, 7) can be applied in another variant of the method according to the invention, either building upon an exposed barrier layer 6 or directly on a system of vias 7. In particular, chromium or chromium alloys are suitable for this metal layer 14, so that this configuration can be used to achieve very low dark currents. The photodiode comprised of amorphous or microcrystalline silicon 12 or alloys thereof along with a contact layer 13 are then applied to this structure.

Figure 8:
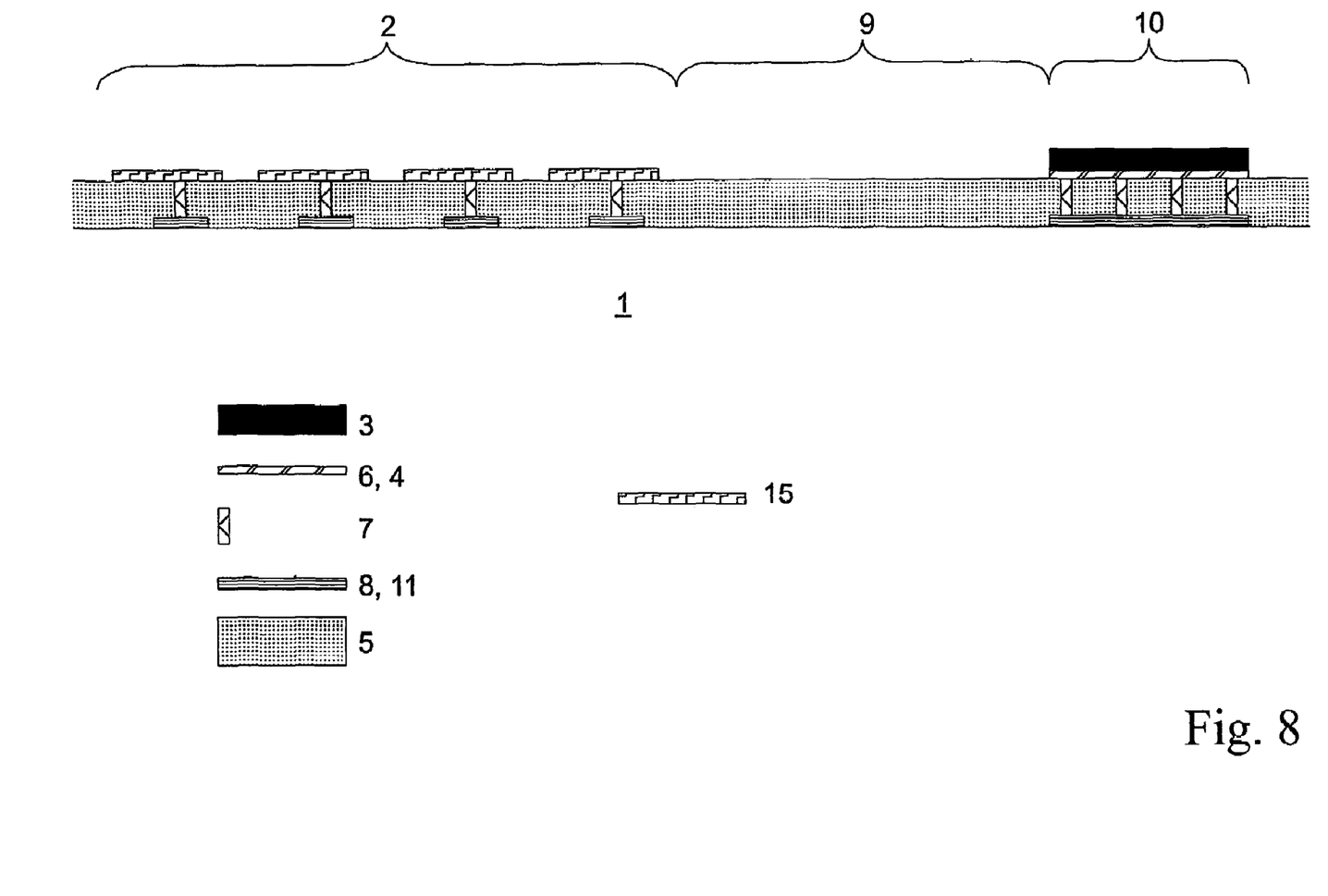
FIG. 8: The ASIC circuit according to FIG. 4, in which a doped silicon layer structured in the pixel grid was deposited on a system of vias.
Figure 9:
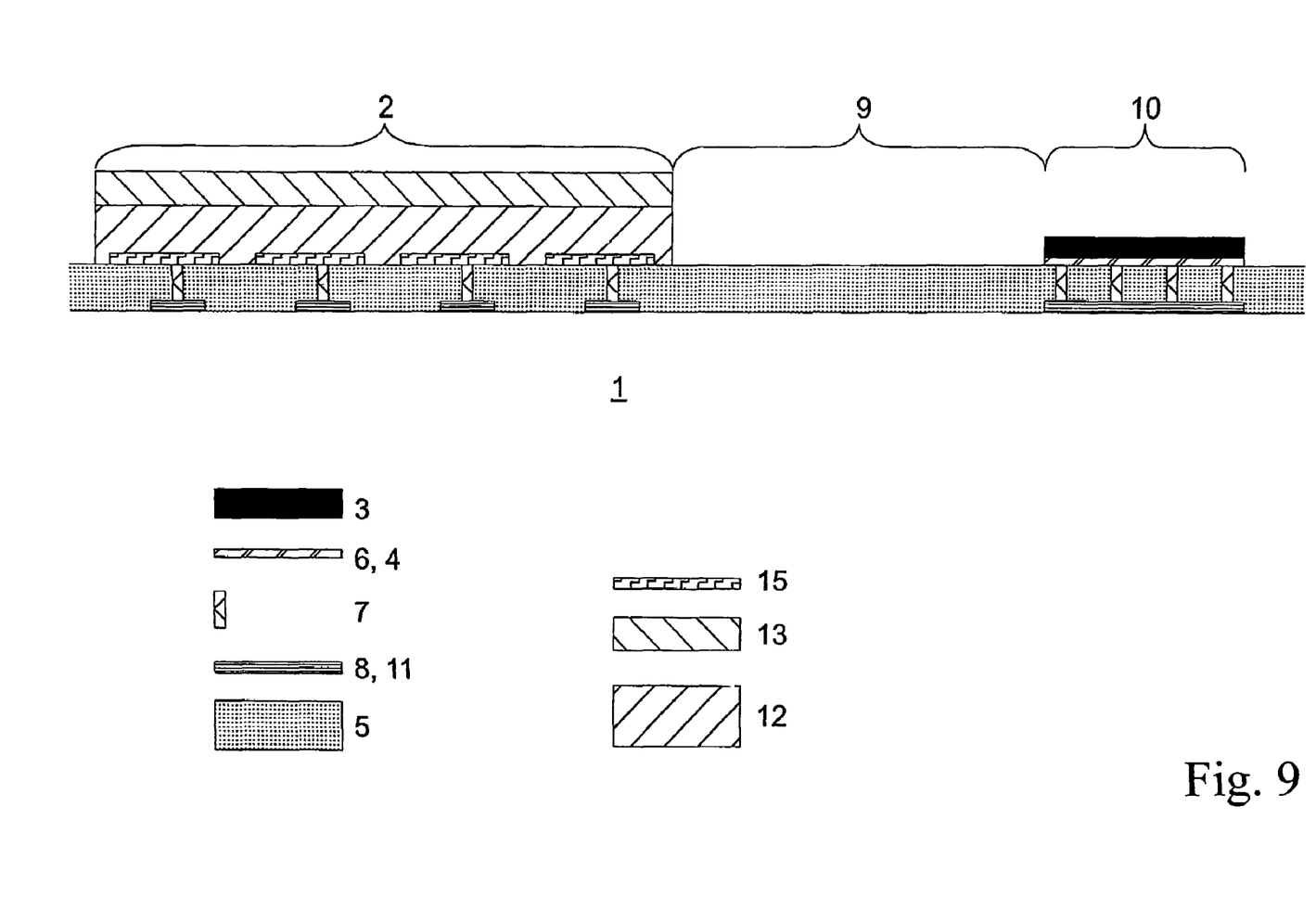
FIG. 9: The ASIC circuit according to FIG. 8, in which the multi-layer system of the photodiode in the photoactive area including amorphous or microcrystalline silicon or alloys thereof was directly deposited on the doped silicon layer.

In another variant of the method according to the invention, the back electrode of the photodiode is fabricated out of a pixel-grid structured, doped layer 15 that consists of amorphous or microcrystalline silicon or alloys thereof FIGS. 8, 9). This doped layer 15 can be directly applied to the intermediate metal dielectric component 5, the bottom structured barrier layer 6 or the metal layer 14. The photodiode consisting of amorphous or microcrystalline silicon 12 or alloys thereof along with a contact layer 13 are then applied to this structure.

In each of the mentioned variants, the photodiode can be designed as a pin-, nip-, Schottky diode or a color sensor including amorphous or microcrystalline silicon or alloys thereof, if necessary with additional materials.

Having thus described at least one illustrative embodiment of the invention, various alterations, modifications, and improvements will readily occur to those skilled in the art. Such alterations, modifications, and improvements are intended to be within and scope of the invention. Accordingly, the foregoing description is by way of example only and is not intended as limiting. The invention is limited only as defined in the following claims and the equivalents thereto.

REFERENCE LIST

1 CMOS-ASIC circuit
2 Photoactive area
3 CMOS metallization (metal 2)
4 Barrier layer
5 Intermediate metal dielectric component
6 Barrier layer
7 Via
8 Strip conductor (metal 1)
9 Peripheral electronics
10 Bond pad
11 Strip conductor
12 Amorphous or monocrystalline silicon
13 Contact layer (TCO)
14 Metal layer (metal 3)
15 Doped layer

What is claimed is:

1. A method for producing a photodiode contact for a TFA image sensor with a photodiode by depositing a multi-layer system and a transparent, conductive contact layer on a CMOS-ASIC circuit that has been coated with an intermediate metal dielectric component and that has vias in a pixel grid in a photoactive area, which extend through the intermediate metal dielectric component and are each linked with a respective strip conductor of the CMOS-ASIC circuit, wherein the intermediate metal dielectric component accommodates a barrier layer, which is structured in the pixel grid and carries a CMOS metallization, the method comprising:
    removing at least the CMOS metallization located on the CMOS-ASIC circuit in the photoactive area up to the barrier layer; and
    subsequently applying the multi-layer system of the photodiode along with the transparent, conductive contact layer to the CMOS-ASIC circuit.

2. The method according to claim 1, further comprising removing the CMOS metallization and barrier layer located under the CMOS metallization in the photoactive area, so that the intermediate metal dielectric component that has vias therein is exposed, after which the photodiode and transparent, conductive contact layer are applied.

3. The method according to claim 1, further comprising applying a pixel-grid structured metal layer to the intermediate metal dielectric component.

4. The method according to claim 1, further comprising applying a pixel-grid structured metal layer to the barrier layer.

5. The method according to claim 3, wherein the metal layer comprises chromium.

6. The method according to claim 3, wherein the metal layer comprises a chromium alloy.

7. The method according to claim 1, further comprising applying a pixel-grid structured, doped layer comprising silicon to the intermediate metal dielectric component.

8. The method according to claim 1, further comprising applying a pixel-grid structured, doped layer comprising silicon to the barrier layer.

9. The method according to claim 7, further comprising applying a pixel-grid structured metal layer to the intermediate metal dielectric component, wherein the doped layer comprising silicon is applied following the application of the pixel-grid structured metal layer.

10. The method according to claim 7, wherein the doped layer comprising silicon is fabricated from amorphous silicon or alloys thereof.

11. The method according to claim 7, wherein the doped layer comprising silicon is fabricated from microcrystalline silicon or alloys thereof.

12. A method for producing a photodiode contact for a TFA image sensor having a photodiode, the method comprising:
    providing a CMOS-ASIC circuit comprising an intermediate metal dielectric component, the CMOS-ASIC circuit comprising vias in a pixel grid in a photoactive area, the vias extending through the intermediate metal dielectric component, and each via being linked with a respective strip conductor of the CMOS-ASIC circuit; wherein the intermediate metal dielectric component accommodates a barrier layer which is structured in the pixel grid and carries a CMOS metallization;
    removing a portion of the CMOS metallization up to at least the barrier layer, the portion being located on the CMOS-ASIC circuit in the photoactive area; and
    applying a layer comprising silicon and a conductive contact layer to the CMOS-ASIC circuit.

13. The method according to claim 12, further comprising applying a pixel-grid structured metal layer to the barrier layer.

14. The method according to claim 12, further comprising removing the barrier layer in the photoactive area so that the intermediate metal dielectric component comprising vias is exposed, before applying the layer of silicon and the conductive contact layer to the CMOS-ASIC circuit.

15. The method according to claim 14, further comprising applying a pixel-grid structured metal layer to the intermediate metal dielectric component.

16. The method according to claim 13, wherein applying the pixel-grid structured metal layer comprises applying a chromium layer.

17. The method according to claim 13, wherein the pixel-grid structured metal layer comprises applying a chromium alloy layer.

18. The method according to claim 12, further comprising applying a pixel-grid structured, doped layer comprising silicon to the barrier layer.

19. The method according to claim 14, further comprising applying a pixel-grid structured, doped layer comprising silicon to the intermediate metal dielectric component.

20. The method according to claim 14, further comprising applying a pixel-grid structured doped layer comprising silicon to the intermediate metal dielectric component, wherein the doped layer comprising silicon is applied following the application of the pixel-grid structured metal layer.

21. The method according to claim 19, wherein applying the doped layer comprising silicon comprises applying an amorphous silicon.

22. The method according to claim 21, wherein applying the amorphous silicon comprises applying silicon alloys.

23. The method according to claim 19, wherein applying the doped layer comprising silicon comprises applying microcrystalline silicon.

24. The method according to claim 23, wherein applying the microcrystalline silicon comprises applying silicon alloys.

* * * * *